United States Patent
Takahashi et al.

(10) Patent No.: US 11,863,161 B2
(45) Date of Patent: Jan. 2, 2024

(54) ACOUSTIC WAVE FILTER

(71) Applicant: Murata Manufacturing Co., Ltd., Nagaokakyo (JP)

(72) Inventors: Tetsu Takahashi, Nagaokakyo (JP); Toru Yamaji, Nagaokakyo (JP); Takuma Kuzushita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 542 days.

(21) Appl. No.: 17/108,039

(22) Filed: Dec. 1, 2020

(65) Prior Publication Data
US 2021/0203306 A1    Jul. 1, 2021

(30) Foreign Application Priority Data
Dec. 27, 2019    (JP) ................................ 2019-238832

(51) Int. Cl.
*H03H 9/02* (2006.01)
*H03H 9/25* (2006.01)
*H03H 9/64* (2006.01)
*H03H 9/145* (2006.01)

(52) U.S. Cl.
CPC ...... *H03H 9/6483* (2013.01); *H03H 9/02543* (2013.01); *H03H 9/145* (2013.01); *H03H 9/25* (2013.01)

(58) Field of Classification Search
None
See application file for complete search history.

(56) References Cited

U.S. PATENT DOCUMENTS

| 6,593,678 | B1 | 7/2003 | Flowers |
| 8,188,812 | B2* | 5/2012 | Tanaka ................. H03H 9/6483 333/133 |
| 8,552,818 | B2* | 10/2013 | Kadota ............. H03H 9/02559 333/195 |
| 2009/0322444 | A1 | 12/2009 | Tanaka |
| 2013/0021116 | A1 | 1/2013 | Sogoya et al. |
| 2018/0048290 | A1 | 2/2018 | Sekine et al. |

(Continued)

FOREIGN PATENT DOCUMENTS

| JP | 09-167937 A | 6/1997 |
| JP | 2010-11300 A | 1/2010 |
| JP | 2012-147175 A | 8/2012 |

(Continued)

OTHER PUBLICATIONS

Official Communication issued in corresponding Japanese Patent Application No. 2019-238832 dated Apr. 26, 2020.

*Primary Examiner* — Kenneth B Wells
(74) *Attorney, Agent, or Firm* — Keating & Bennett, LLP

(57) ABSTRACT

An acoustic wave filter includes a first resonance circuit including a first series arm resonator and a first capacitive element. The first series arm resonator is provided on a path connecting a first terminal and a second terminal. The first capacitive element is coupled in parallel with the first series arm resonator. The first series arm resonator includes a first divided resonator and a second divided resonator coupled in series with each other. The first resonance circuit includes a second resonance circuit including the first divided resonator and a second capacitive element coupled in parallel with the first divided resonator.

20 Claims, 8 Drawing Sheets

(56) References Cited

U.S. PATENT DOCUMENTS

2018/0367120 A1    12/2018  Konaka

FOREIGN PATENT DOCUMENTS

| JP | 2018-026735 A | 2/2018 |
| WO | 2011/142143 A1 | 11/2011 |
| WO | 2014/034492 A1 | 3/2014 |
| WO | 2017/154260 A1 | 9/2017 |

* cited by examiner

FIG. 2A
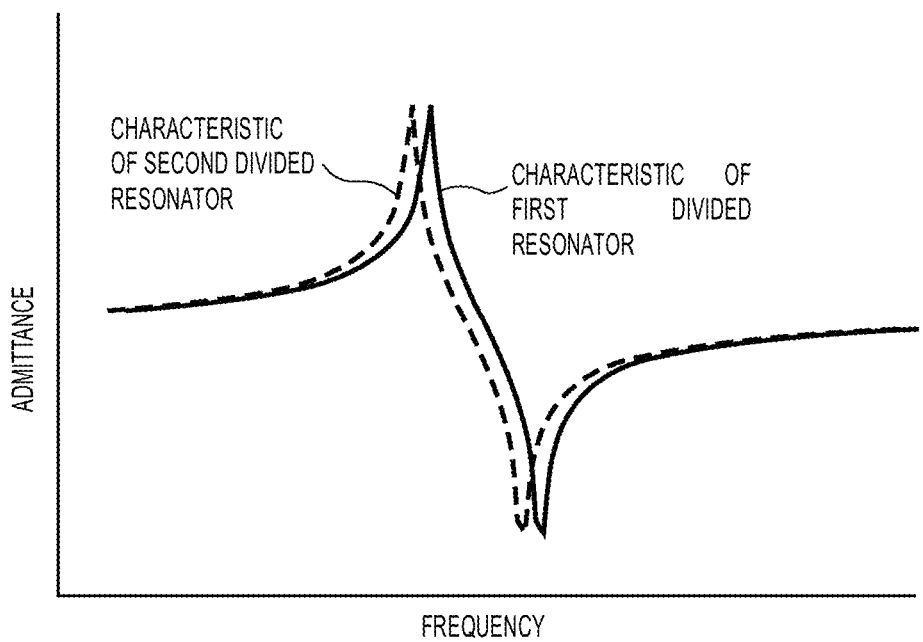
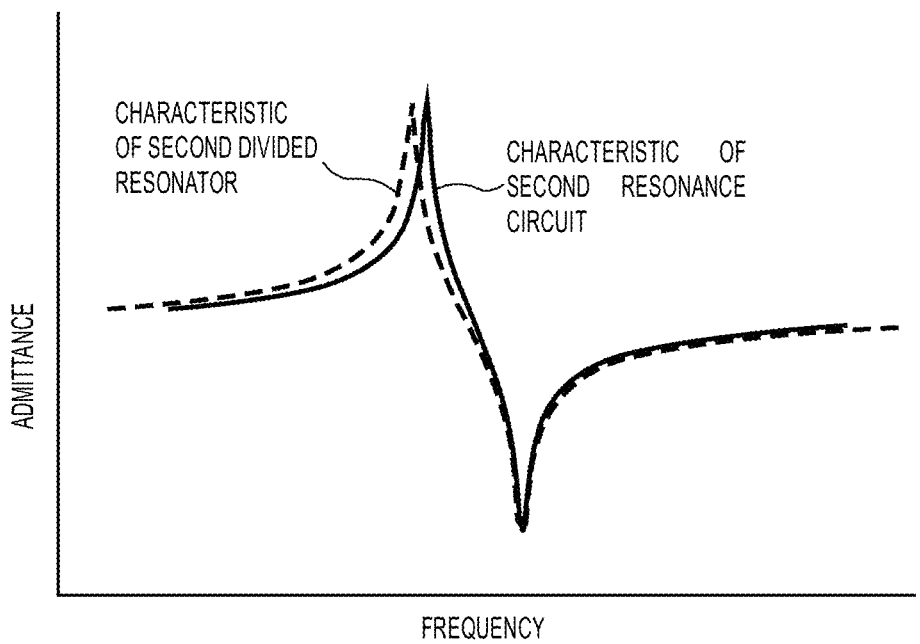
FIG. 2B

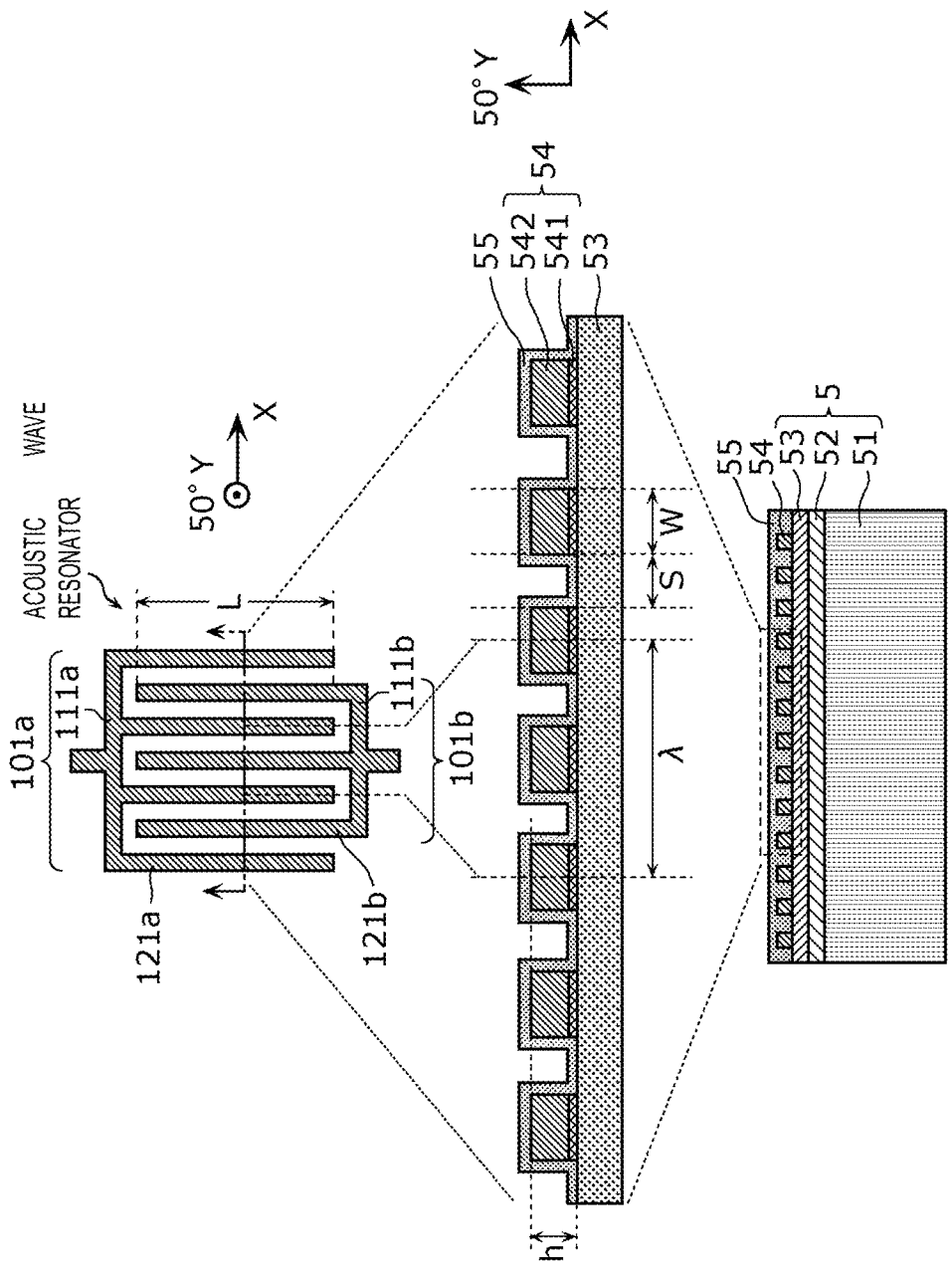

ACOUSTIC WAVE FILTER

CROSS REFERENCE TO RELATED APPLICATIONS

This application claims the benefit of priority to Japanese Patent Application No. 2019-238832 filed on Dec. 27, 2019. The entire contents of this application are hereby incorporated herein by reference.

BACKGROUND OF THE INVENTION

1. Field of the Invention

The present invention relates to an acoustic wave filter.

2. Description of the Related Art

Ladder acoustic wave filters including a series arm resonator and a parallel arm resonator have become known. As an example of such acoustic wave filters, U.S. Pat. No. 6,593,678 discloses an acoustic wave filter including a first series arm resonator, a second series arm resonator coupled in series with the first series arm resonator, and a parallel arm resonator coupled to a node between a first series arm resonator and a second series arm resonator. In this acoustic wave filter, a capacitive element is coupled in parallel with the first series arm resonator.

By coupling a capacitive element in parallel with the first series arm resonator as in the acoustic wave filter disclosed in U.S. Pat. No. 6,593,678, it is possible to move an anti-resonant frequency of the first series arm resonator in parallel connection toward a lower frequency. This can achieve a steep attenuation slope on the higher frequency side than the pass band of the acoustic wave filter.

However, it is difficult for the acoustic wave filter disclosed in U.S. Pat. No. 6,593,678 to make fine adjustments to the resonant frequency and anti-resonant frequency of the first series arm resonator, and as a result, it is difficult to reduce the insertion loss on the higher frequency side of the pass band.

SUMMARY OF THE INVENTION

Preferred embodiments of the present invention provide acoustic wave filters that are each able to achieve a steep attenuation slope on a higher frequency side than a pass band of the acoustic wave filter and reduce insertion loss on the higher frequency side of the pass band.

An acoustic wave filter according to a preferred embodiment of the present invention includes a first resonance circuit including a first series arm resonator and a first capacitive element. The first series arm resonator is provided on a path connecting a first terminal and a second terminal. The first capacitive element is coupled in parallel with the first series arm resonator. The first series arm resonator includes a first divided resonator and a second divided resonator coupled in series with each other. The first resonance circuit includes a second resonance circuit including the first divided resonator and a second capacitive element coupled in parallel with the first divided resonator.

The acoustic wave filters according to preferred embodiments of the present invention are each able to achieve a steep attenuation slope on the higher frequency side than the pass band of the acoustic wave filter and reduce the insertion loss on the higher frequency side of the pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B provide graphs illustrating the admittance characteristic of a first divided resonator, the admittance characteristic of a second divided resonator, and the admittance characteristic of a second resonance circuit of an acoustic wave filter according to a preferred embodiment of the present invention.

FIGS. 3A to 3C provide a plan view and sectional views schematically illustrating an example of an acoustic wave resonator included in an acoustic wave filter of a preferred embodiment of the present invention.

DETAILED DESCRIPTION OF THE PREFERRED EMBODIMENTS

Figure 1:
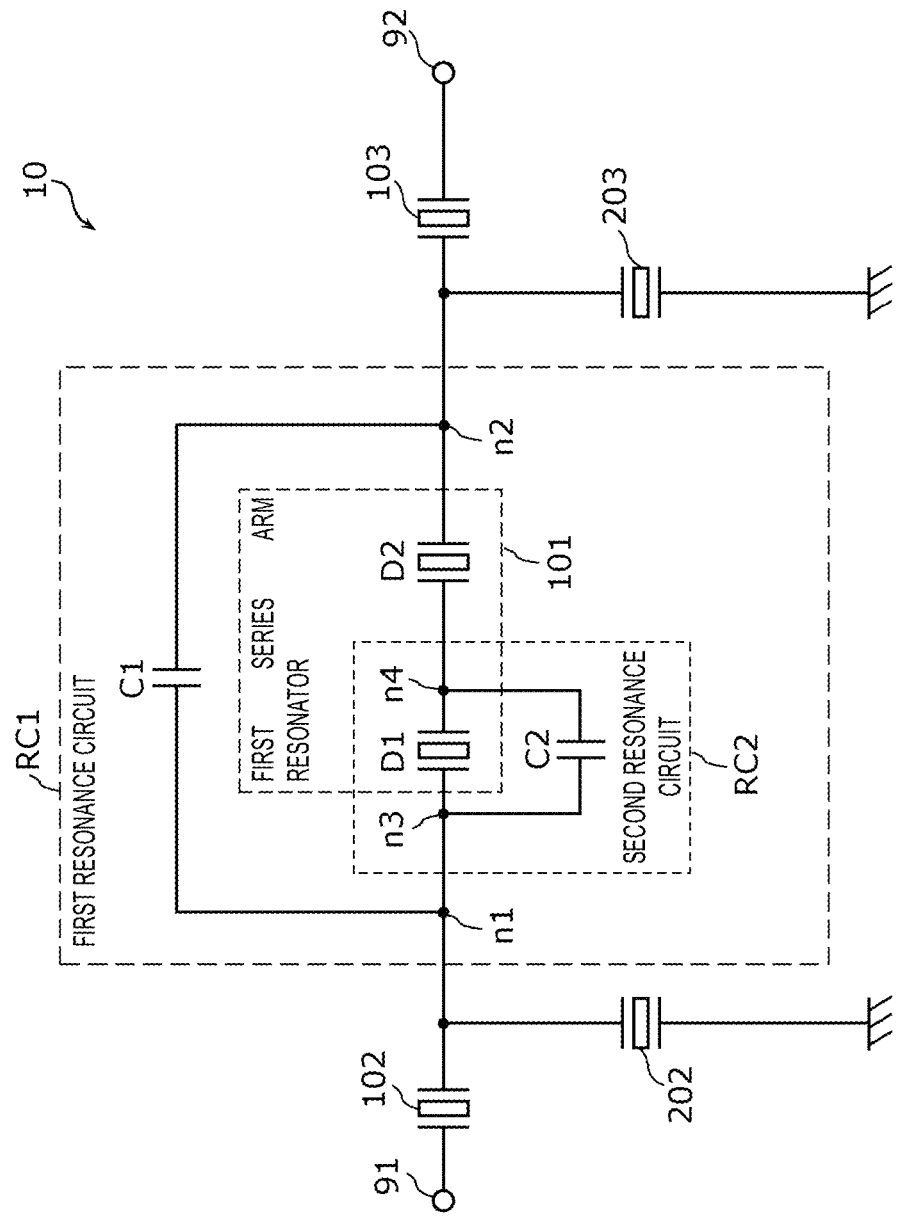
FIG. 1 is a circuit configuration diagram of an acoustic wave filter according to a preferred embodiment of the present invention.

Hereinafter, preferred embodiments of the present invention will be described in detail with reference to the drawings. It should be noted that the preferred embodiments described below are each specific or comprehensive examples. The numerical values, the shapes, the materials, the elements, the arrangements of the elements, the connection configurations, and the like described in the following preferred embodiments are mere examples and are not intended to limit the present invention. Among the elements in the following preferred embodiments, elements not recited in any of the independent claims are described as arbitrary or optional elements. Furthermore, the size or the size ratio of the elements illustrated in the drawings is not necessarily presented in an exact manner.

Preferred Embodiments

1. Fundamental Configuration of Acoustic Wave Filter

FIG. 1 is a circuit configuration diagram of an acoustic wave filter 10 according to a preferred embodiment of the present invention.

The acoustic wave filter 10 includes a plurality of series arm resonators 101, 102 and 103 provided on a path connecting a first terminal 91 and a second terminal 92 and a plurality of parallel arm resonators 202 and 203 provided between the path and the ground (reference terminal). The series arm resonator 102 is provided between the first terminal 91 and the series arm resonator 101. The series arm resonator 103 is provided between the series arm resonator 101 and the second terminal 92.

In the following description, among the plurality of series arm resonators 101 to 103, the series arm resonator 101 is also referred to as the first series arm resonator 101, and the series arm resonators 102 and 103 different from the first series arm resonator 101 are also referred to as the second series arm resonators 102 and 103.

As illustrated in FIG. 1, a first capacitive element C1 is coupled in parallel with the first series arm resonator 101. Specifically, one terminal of the first capacitive element C1 is coupled to a node n1 between the first series arm resonator 101 and the second series arm resonator 102, and the other terminal of the first capacitive element C1 is coupled to a node n2 between the first series arm resonator 101 and the second series arm resonator 103.

As such, the acoustic wave filter 10 includes a first resonance circuit RC1 including the first series arm resonator 101 and the first capacitive element C1 coupled in parallel with the first series arm resonator 101.

The first series arm resonator 101 includes two divided resonators. Here, a series divided resonator is defined as each of the two resonators coupled in series with each other without a parallel arm resonator coupled between a node between the two resonators and the ground. Specifically, the first series arm resonator 101 includes a first divided resonator D1 and a second divided resonator D2 coupled in series with each other. The first divided resonator D1 is coupled in series with the second series arm resonator 102. The second divided resonator D2 is coupled in series with the second series arm resonator 103. The first divided resonator D1 has a resonance frequency and an anti-resonant frequency higher than those of the second divided resonator D2. The resonant frequency or anti-resonant frequency denotes a resonant frequency or anti-resonant frequency inherent in the first divided resonator D1 not coupled to any capacitive element.

A second capacitive element C2 is coupled in parallel with the first divided resonator D1. Specifically, one terminal of the second capacitive element C2 is coupled to a node n3 between the first divided resonator D1 and the second series arm resonator 102; and the other terminal of the second capacitive element C2 is coupled to a node n4 between the first divided resonator D1 and the second divided resonator D2.

The second capacitive element C2 has a different capacitance than that of the first capacitive element C1. Specifically, the capacitance of the second capacitive element C2 is lower than the capacitance of the first capacitive element C1, and more specifically, the capacitance of the second capacitive element C2 is preferably, for example, in the range of about 0.1 to about 0.3 times the capacitance of the first capacitive element C1.

No capacitive element is coupled in parallel with the second divided resonator D2. Furthermore, no parallel arm resonator is coupled between the ground and any node between the first divided resonator D1 and the second divided resonator D2.

As described above, the first resonance circuit RC1 includes a second resonance circuit RC2 including the first divided resonator D1 and the second capacitive element C2 and also includes the second divided resonator D2 coupled in series with the second resonance circuit RC2.

The anti-resonant frequency of the second resonance circuit RC2 is the same or substantially the same as the anti-resonant frequency of the second divided resonator D2. In other words, the capacitance of the second capacitive element C2 is configured such that the anti-resonant frequency of the second resonance circuit RC2 is the same or substantially the same as the anti-resonant frequency of the second divided resonator D2. Here, "substantially the same" means, for example, that the difference between the anti-resonant frequency of the second resonance circuit RC2 and the anti-resonant frequency of the second divided resonator D2 is in the range of about 0.2% to about 5%.

FIGS. 2A and 2B provide graphs illustrating the admittance characteristic of the first divided resonator D1, the admittance characteristic of the second divided resonator D2, and the admittance characteristic of the second resonance circuit RC2.

FIG. 2A illustrates the admittance characteristic of the first divided resonator D1 and the admittance characteristic of the second divided resonator D2. As illustrated in the graph, the resonant frequency of the first divided resonator D1 is higher than the resonant frequency of the second divided resonator D2, and the anti-resonant frequency of the first divided resonator D1 is higher than the anti-resonant frequency of the second divided resonator D2.

FIG. 2B illustrates the admittance characteristic of the second resonance circuit RC2 and the admittance characteristic of the second divided resonator D2. Since the second capacitive element C2 is coupled in parallel with the first divided resonator D1, the anti-resonant frequency of the second resonance circuit RC2 indicated in FIG. 2B is lower than the anti-resonant frequency of the first divided resonator D1 indicated in FIG. 2A. In the present preferred embodiment, the anti-resonant frequency of the second resonance circuit RC2 is close to, and more precisely, the same or substantially the same as the anti-resonant frequency of the second divided resonator D2.

Furthermore, as indicated in FIG. 2B, the resonant frequency of the second resonance circuit RC2 is higher than the resonant frequency of the second divided resonator D2. As a result, the resonance bandwidth, which is a range between a resonant frequency and an anti-resonant frequency, of the second resonance circuit RC2 is narrower than the resonance bandwidth of the second divided resonator D2. The difference between the anti-resonant frequency of the second resonance circuit RC2 and the anti-resonant frequency of the second divided resonator D2 is smaller than the difference between the resonant frequency of the second resonance circuit RC2 and the resonant frequency of the second divided resonator D2.

As described above, by using the anti-resonant frequency of the first resonance circuit RC1 including the second resonance circuit RC2 defined by coupling the second capacitive element C2 in parallel with the first divided resonator D1, it is possible to define an attenuation pole on the higher frequency side than the pass band. Furthermore, the increase of the resonant frequency of the second resonance circuit RC2 increases the resonant frequency of the first resonance circuit RC1, and as a result, it is possible to reduce the insertion loss on the higher frequency side of the pass band of the acoustic wave filter 10.

Here, the connection configuration of the resonance circuit and the resonators included in the acoustic wave filter 10 is described again.

The first resonance circuit RC1 described above is provided on the path connecting the first terminal 91 and the second terminal 92. The second series arm resonator 102 is coupled between the first terminal 91 and the first resonance circuit RC1 in series with the first resonance circuit RC1. The second series arm resonator 103 is coupled between the first resonance circuit RC1 and the second terminal 92 in series with the first resonance circuit RC1. The parallel arm resonator 202 is provided between the ground and a node between the second series arm resonator 102 and the first resonance circuit RC1. The parallel arm resonator 203 is provided between the ground and a node between the first resonance circuit RC1 and the second series arm resonator 103.

With the connection configuration described above, the acoustic wave filter 10 forms a ladder band pass filter. The resonant frequency of the first resonance circuit RC1, the resonant frequency of the second series arm resonator 102, and the resonant frequency of the second series arm resonator 103 are all within the pass band of the acoustic wave filter 10. The anti-resonant frequency of the first resonance circuit RC1 is higher than the pass band and lower than the anti-resonant frequency of the second series arm resonator 102 and the anti-resonant frequency of the second series arm resonator 103.

As described above, by configuring the first resonance circuit RC1 to have an anti-resonant frequency lower than the anti-resonant frequency of the series arm resonator 102 and the anti-resonant frequency of the series arm resonator 103, it is possible to define an attenuation pole on the higher frequency side than the pass band. As such, it is possible to define the attenuation pole of the acoustic wave filter 10 and also reduce the insertion loss on the higher frequency side of the pass band.

2. Structure of Acoustic Wave Filter

The following description is for a structure of the acoustic wave filter 10 that has the configuration described above.

The acoustic wave filter 10 is a surface acoustic wave filter including a plurality of acoustic wave resonators, such as the series arm resonators 101 to 103 and the parallel arm resonators 202 and 203, for example.

FIGS. 3A to 3C schematically illustrate examples of an acoustic wave resonator included in the acoustic wave filter 10, in which FIG. 3A is a plan view and FIGS. 3B and 3C are sectional views taken along the dot-dash line illustrated in FIG. 3A. The acoustic wave resonator illustrated in FIGS. 3A to 3C are used only to explain a typical structure of the plurality of acoustic wave resonators, and thus, the number of electrode fingers of an electrode, the length of electrode fingers, and the like are not limited to this example.

The acoustic wave resonator includes a substrate 5 with piezoelectricity and comb-shaped electrodes 101$a$ and 101$b$.

As illustrated in FIG. 3A, the comb-shaped electrodes 101$a$ and 101$b$ facing each other in a pair are provided on the substrate 5. The comb-shaped electrode 101$a$ includes a plurality of electrode fingers 121$a$ parallel or substantially parallel to each other and a busbar electrode 111$a$ connecting the electrode fingers 121$a$ to each other. The comb-shaped electrode 101$b$ includes a plurality of electrode fingers 121$b$ parallel or substantially parallel to each other and a busbar electrode 111$b$ connecting the electrode fingers 121$b$ to each other. The plurality of electrode fingers 121$a$ and 121$b$ extend in a direction perpendicular or substantially perpendicular to a propagation direction of acoustic waves (the X-axis direction).

An interdigital transducer (IDT) electrode 54 including the electrode fingers 121$a$ and 121$b$ and the busbar electrodes 111$a$ and 111$b$ has a layered structure including a fixing layer 541 and a main electrode layer 542 as illustrated in FIG. 3B.

The fixing layer 541 improves the firmness of the substrate 5 and the main electrode layer 542 and, for example, Ti is preferably used as a material of the fixing layer 541. The thickness of the fixing layer 541 is preferably, for example, about 12 nm.

As a material of the main electrode layer 542, for example, Al including about 1% Cu is preferably used. The thickness of the main electrode layer 542 is preferably, for example, about 162 nm.

A protective layer 55 covers the comb-shaped electrodes 101$a$ and 101$b$. The protective layer 55 is provided to protect the main electrode layer 542 from the external environment, control the frequency temperature characteristic, increase moisture resistance, and the like. The protective layer 55 is preferably, for example, a dielectric film mainly including silicon dioxide. The thickness of the protective layer 55 is preferably, for example, about 25 nm.

Materials included in the fixing layer 541, the main electrode layer 542, and the protective layer 55 are not limited to the materials described above. Furthermore, the IDT electrode 54 does not necessarily have the layered structure described above. The IDT electrode 54 may be made of, for example, a metal, such as Ti, Al, Cu, Pt, Au, Ag, or Pd, or an alloy thereof, or may be defined by a plurality of multilayer bodies made of the metal or the alloy. Additionally, the protective layer 55 is not necessarily provided.

Next, a layered structure of the substrate 5 is described.

As illustrated in FIG. 3C, the substrate 5 includes a high-acoustic-velocity support substrate 51, a low-acoustic-velocity film 52, and a piezoelectric film 53, and has a structure including the high-acoustic-velocity support substrate 51, the low-acoustic-velocity film 52, and the piezoelectric film 53 layered in this order.

The piezoelectric film 53 is preferably made of, for example, a 50° Y-cut X-propagation LiTaO3 piezoelectric single crystal or piezoelectric ceramic (a lithium tantalate single crystal or ceramic that is cut at a plane perpendicular or substantially perpendicular to a normal line obtained by rotating an axis about an X-axis as a central axis by about 50° from a Y-axis and in which surface acoustic waves propagate in the X-axis direction). The thickness of the piezoelectric film 53 is preferably, for example, about 600 nm. The material and the cut-angle for a piezoelectric single crystal used for the piezoelectric film 53 are selected as appropriate in accordance with required specifications of individual filters.

The high-acoustic-velocity support substrate 51 supports the low-acoustic-velocity film 52, the piezoelectric film 53, and the IDT electrode 54. The high-acoustic-velocity support substrate 51 is also configured such that bulk waves in the high-acoustic-velocity support substrate 51 are faster in velocity than acoustic waves such as surface acoustic waves and boundary waves propagating along the piezoelectric film 53. The high-acoustic-velocity support substrate 51 confines surface acoustic waves in a portion provided by layering the piezoelectric film 53 and the low-acoustic-velocity film 52 so that the surface acoustic waves do not leak down below the high-acoustic-velocity support substrate 51. The high-acoustic-velocity support substrate 51 is preferably, for example, a silicon substrate. The thickness of the high-acoustic-velocity support substrate 51 is preferably, for example, about 200 μm.

The low-acoustic-velocity film 52 is configured such that bulk waves in the low-acoustic-velocity film 52 are slower in velocity than bulk waves propagating in the piezoelectric film 53. The low-acoustic-velocity film 52 is disposed between the piezoelectric film 53 and the high-acoustic-velocity support substrate 51. This structure and a property of acoustic wave in which energy is naturally concentrated in low-acoustic-velocity media reduces or prevents leakage of surface acoustic wave energy outside the IDT electrode 54. The low-acoustic-velocity film 52 is preferably mainly made of, for example, silicon dioxide. The thickness of the low-acoustic-velocity film 52 is preferably, for example, about 670 nm.

Here, an example of electrode parameters for the IDT electrode 54 of the acoustic wave resonator is described.

The wave length of acoustic wave resonator is defined as a wave length $\lambda$ that is the repetition cycle of the electrode fingers 121*a* or 121*b* constituting the IDT electrode 54 illustrated in FIG. 3B. The electrode pitch is ½ of the wave length $\lambda$ and defined as (W+S), where the line width of the electrode fingers 121*a* and 121*b* constituting the comb-shaped electrodes 101*a* and 101*b* is W and the space width between an electrode finger 121*a* and an electrode finger 121*b* is S. An overlap width L of the comb-shaped electrodes 101*a* and 101*b* in a pair is, as illustrated in FIG. 3A, the overlap length of the overlapping electrode fingers 121*a* and 121*b* as viewed in the propagation direction of acoustic waves (the X-axis direction). The electrode duty of each acoustic wave resonator is the line width occupancy rate of the electrode fingers 121*a* and 121*b*, that is, the rate of the line width to the sum of the line width and the space width of the electrode fingers 121*a* and 121*b*, which is defined as W/(W+S). The height of the comb-shaped electrodes 101*a* and 101*b* is h. Parameters defining the shape and size of the acoustic wave resonator such as the wave length $\lambda$, the overlap width L, the electrode duty, and the height h of the IDT electrode 54 are referred to as resonator parameters.

Next, a structure of the first resonance circuit RC1 of the acoustic wave filter 10 will be described.

Figure 4:
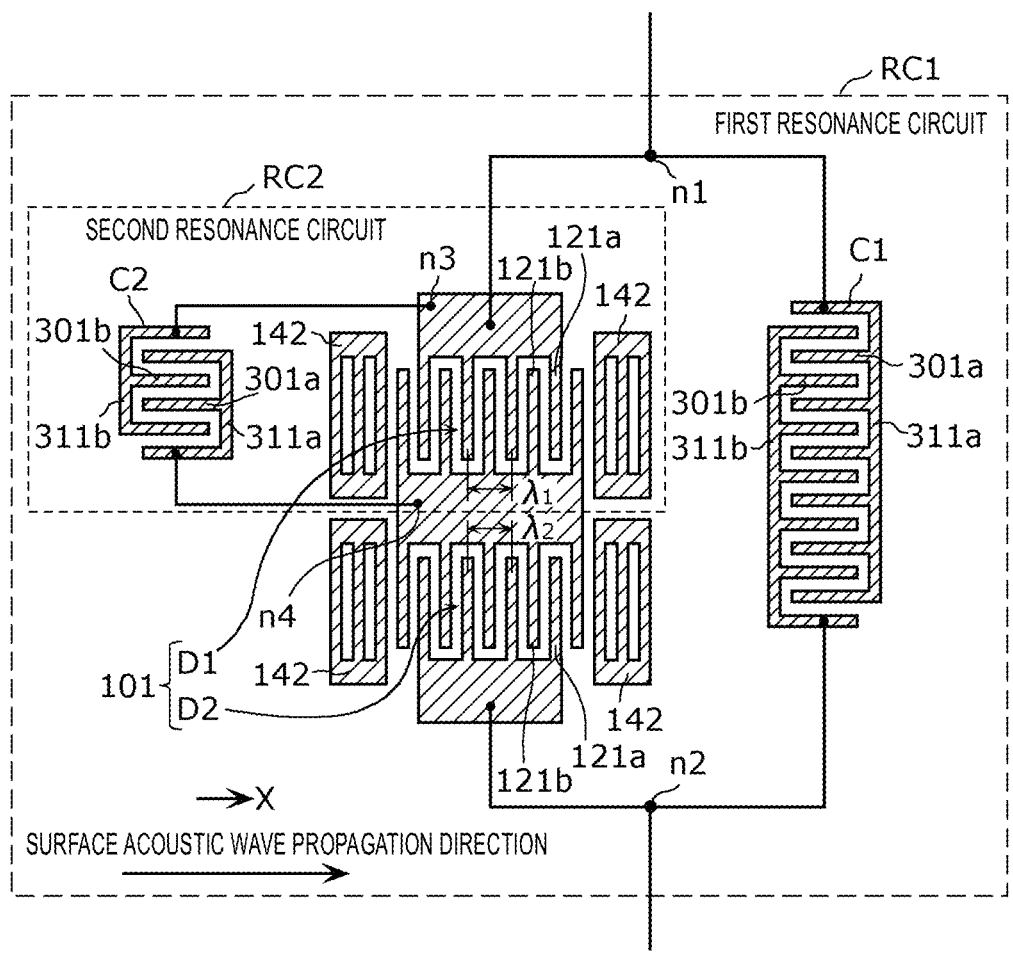
FIG. 4 is a plan view schematically illustrating a first resonance circuit of an acoustic wave filter according to a preferred embodiment of the present invention.

FIG. 4 is a plan view schematically illustrating the first resonance circuit RC1 of the acoustic wave filter 10.

As illustrated in FIG. 4, the first resonance circuit RC1 includes the first series arm resonator 101 and the first capacitive element C1 coupled in parallel with the first series arm resonator 101. The first series arm resonator 101 includes the first divided resonator D1 and the second divided resonator D2 coupled in series with each other. The second capacitive element C2 is coupled in parallel with the first divided resonator D1. The first resonance circuit RC1 is defined by the second resonance circuit RC2 including the first divided resonator D1 and the second capacitive element C2 and the second divided resonator D2 coupled in series with the second resonance circuit RC2.

Reflectors 142 are provided at both ends of the first divided resonator D1 and both ends of the second divided resonator D2. The reflector 142 includes a plurality of electrode fingers parallel to each other and busbar electrodes connecting the electrode fingers to each other.

The first series arm resonator 101 is provided on the substrate 5 such that the plurality of electrode fingers 121*a* and 121*b* of the first series arm resonator 101 are perpendicular or substantially perpendicular to the propagation direction of acoustic waves.

The first divided resonator D1 and the second divided resonator D2 are arranged in this order in the direction perpendicular or substantially perpendicular to the propagation direction of acoustic waves. The first divided resonator D1 has a resonance frequency and an anti-resonant frequency higher than those of the second divided resonator D2. Specifically, a wave length $\lambda 1$ is shorter than a wave length $\lambda 2$, where the wave length $\lambda 1$ is one of the resonator parameters of the first divided resonator D1 and the wave length $\lambda 2$ is one of the resonator parameters of the second divided resonator D2.

The first capacitive element C1 and the second capacitive element C2 each include comb-shaped electrodes. Both of the first capacitive element C1 and the second capacitive element C2 are provided on the substrate 5. Each pair of the comb-shaped electrodes of the first capacitive element C1 and the second capacitive element C2 includes a plurality of electrode fingers 301*a* and 301*b* and a pair of busbar electrodes 311*a* and 311*b*. The electrode fingers 301*a* and 301*b* are parallel or substantially parallel to each other and interleaved with each other. The busbar electrodes 311*a* and 311*b* face each other between which the electrode fingers 301*a* and 301*b* are interposed. The electrode fingers 301*a* are connected to the busbar electrode 311*a*, and the electrode fingers 301*b* are connected to the busbar electrode 311*b*.

The electrode fingers 301*a* and 301*b* are elongated in the propagation direction of surface acoustic waves of the IDT electrode 54 of the series arm resonator 101 and regularly disposed in the direction perpendicular or substantially perpendicular to the propagation direction.

The second capacitive element C2 has a lower capacitance than that of the first capacitive element C1. More specifically, the number of electrode fingers 301*a* and 301*b* of the second capacitive element C2 is less than the number of electrode fingers 301*a* and 301*b* of the first capacitive element C1. The interval between the electrode finger 301*a* and the electrode finger 301*b* of the second capacitive element C2 may be wider than that of the first capacitive element C1. When viewed in the direction perpendicular or substantially perpendicular to the propagation direction of acoustic waves, the overlap length of the overlapping electrode fingers 301*a* and 301*b* of the second capacitive element C2 may be shorter than that of the first capacitive element C1.

3. Frequency Characteristic of Acoustic Wave Filter

Next, the frequency characteristic of the acoustic wave filter 10 will be described in comparison to an acoustic wave filter of a comparative example.

Figure 5:
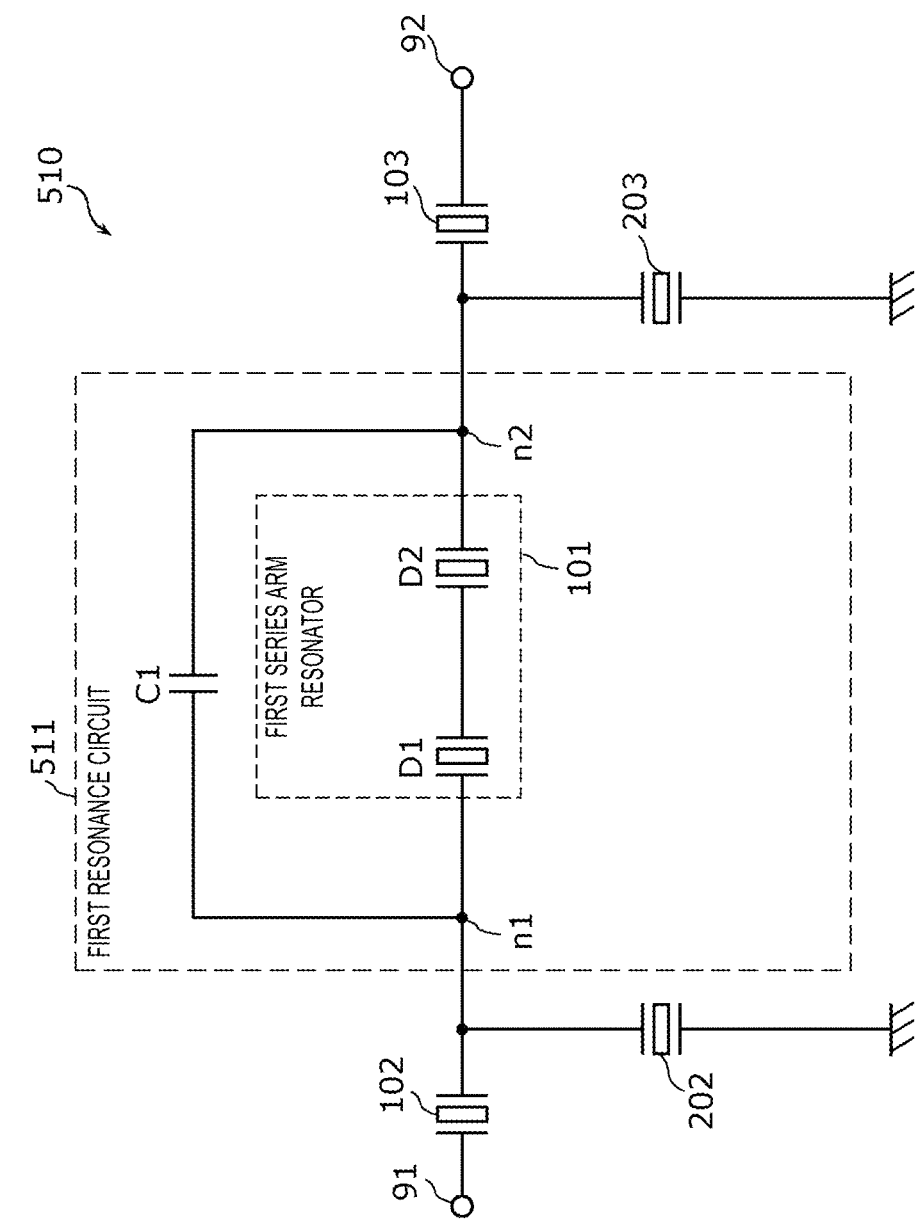
FIG. 5 is a circuit configuration diagram of an acoustic wave filter of a comparative example.

FIG. 5 is a circuit configuration diagram of an acoustic wave filter 510 of a comparative example.

Unlike the acoustic wave filter 10 of the present preferred embodiment, the acoustic wave filter 510 of the comparative example does not include the second capacitive element C2. This means that a first resonance circuit 511 of the comparative example includes only the first series arm resonator 101 and the first capacitive element C1 coupled in parallel with the first series arm resonator 101. The first divided resonator D1 and the second divided resonator D2 are the same or substantially the same as each other with respect to the resonator parameters, the resonant frequency, and the anti-resonant frequency.

Figure 6:
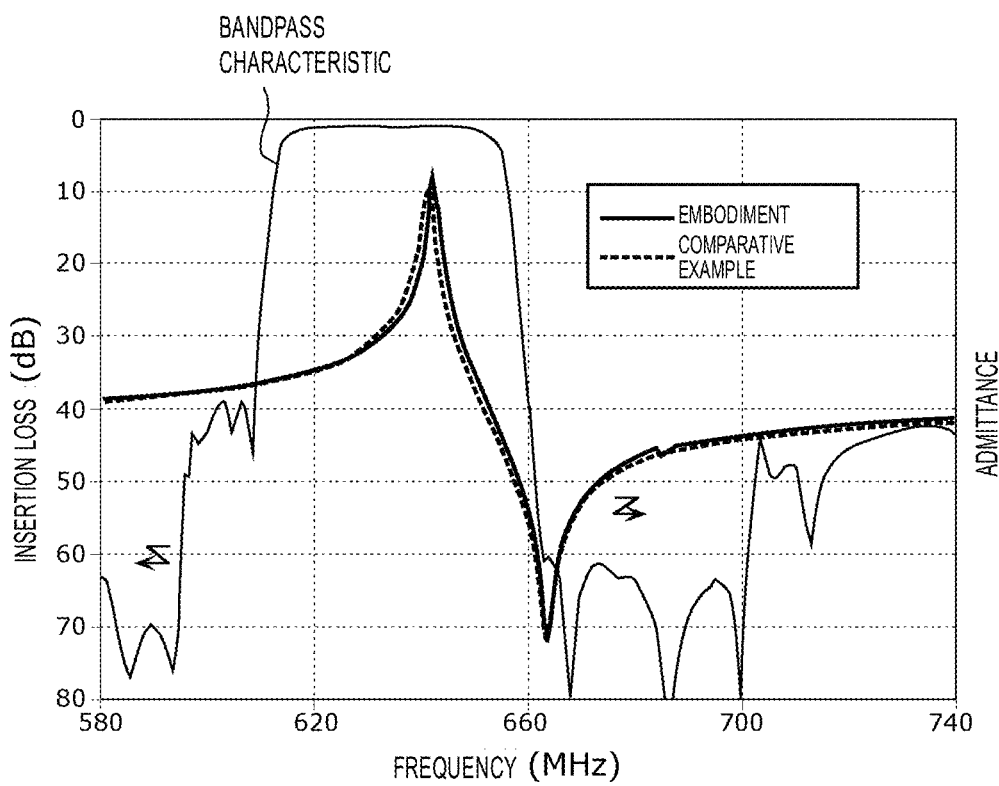
FIG. 6 illustrates the bandpass characteristic of an acoustic wave filter according to a preferred embodiment of the present invention and the admittance characteristic of the first resonance circuit.
Figure 7:
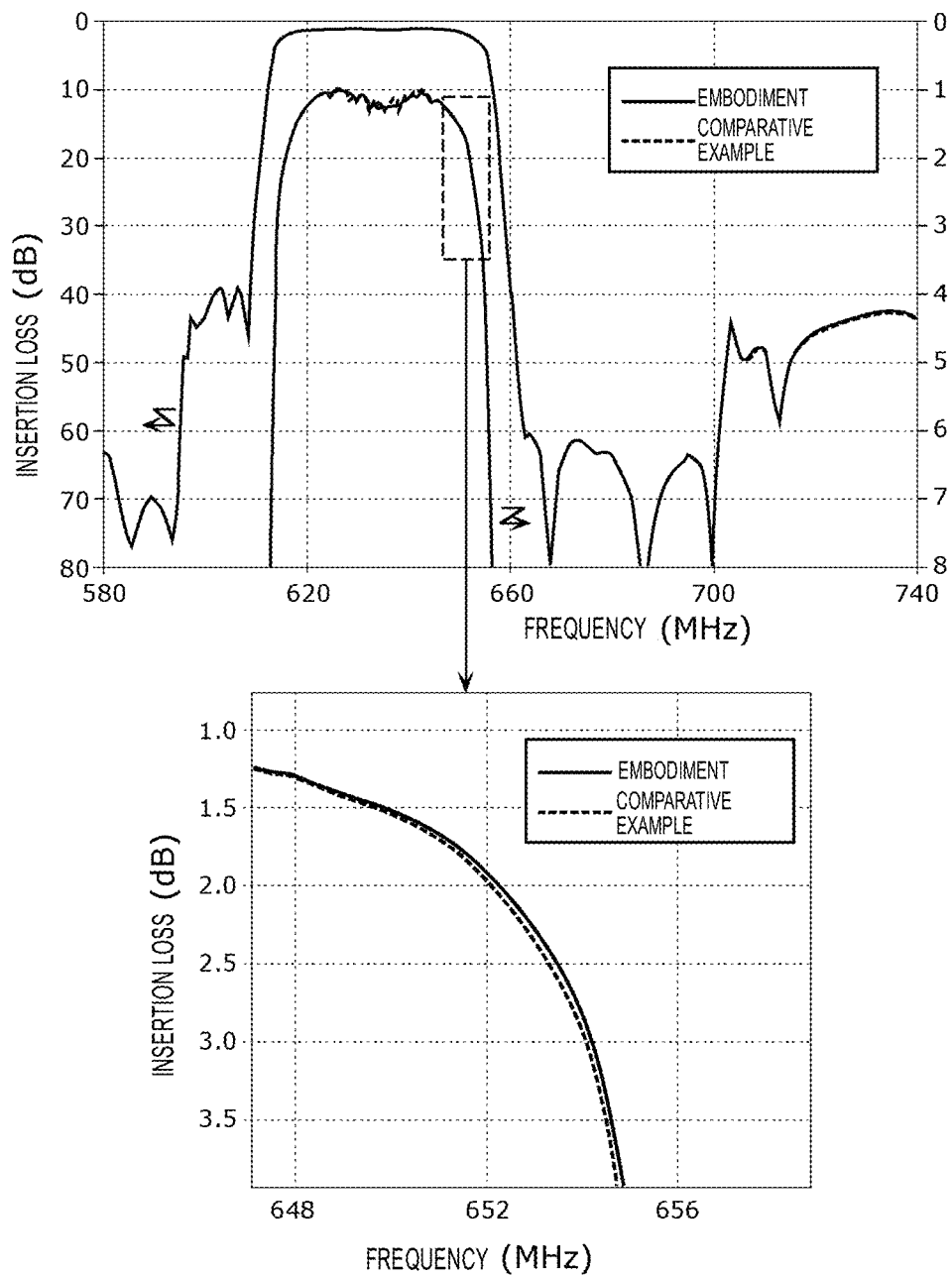
FIG. 7 illustrates the bandpass characteristic of an acoustic wave filter according to a preferred embodiment of the present invention and the bandpass characteristic of the acoustic wave filter of the comparative example.

FIG. 6 illustrates the bandpass characteristic of the acoustic wave filter 10 and the admittance characteristic of the first resonance circuit RC1. FIG. 7 illustrates the bandpass characteristic of the acoustic wave filter 10 of the preferred embodiment and the bandpass characteristic of the acoustic wave filter 510 of the comparative example.

As illustrated in FIG. 6, the anti-resonant frequency of the first resonance circuit RC1 of the present preferred embodiment is the same or substantially the same as the anti-resonant frequency of the first resonance circuit 511 of the comparative example, whereas the resonant frequency of the first resonance circuit RC1 of the present preferred embodiment is higher than the resonant frequency of the first resonance circuit 511 of the comparative example. Additionally, as illustrated in FIG. 7, the insertion loss on the higher frequency side of the pass band is reduced in the acoustic wave filter 10 of the present preferred embodiment more than in the acoustic wave filter 510 of the comparative example. Specifically, the insertion loss in the vicinity of 652 MHz frequency is reduced in the acoustic wave filter 10 more than in the acoustic wave filter 510.

This is because, as described in the present preferred embodiment, by coupling the second capacitive element C2 in parallel with the first divided resonator D1, it is possible to define an attenuation pole on the higher frequency side than the pass band with the use of the anti-resonant frequency of the first resonance circuit RC1 involving the second resonance circuit RC2. Additionally, by increasing the resonant frequency of the first resonance circuit RC1 as a result of increase of the resonant frequency of the second resonance circuit RC2, it is possible to reduce the insertion loss on the higher frequency side of the pass band of the acoustic wave filter 10.

4. Modified Example of Preferred Embodiment

Next, an acoustic wave filter according to a modified example of a preferred embodiment of the present invention will be described.

Figure 8:
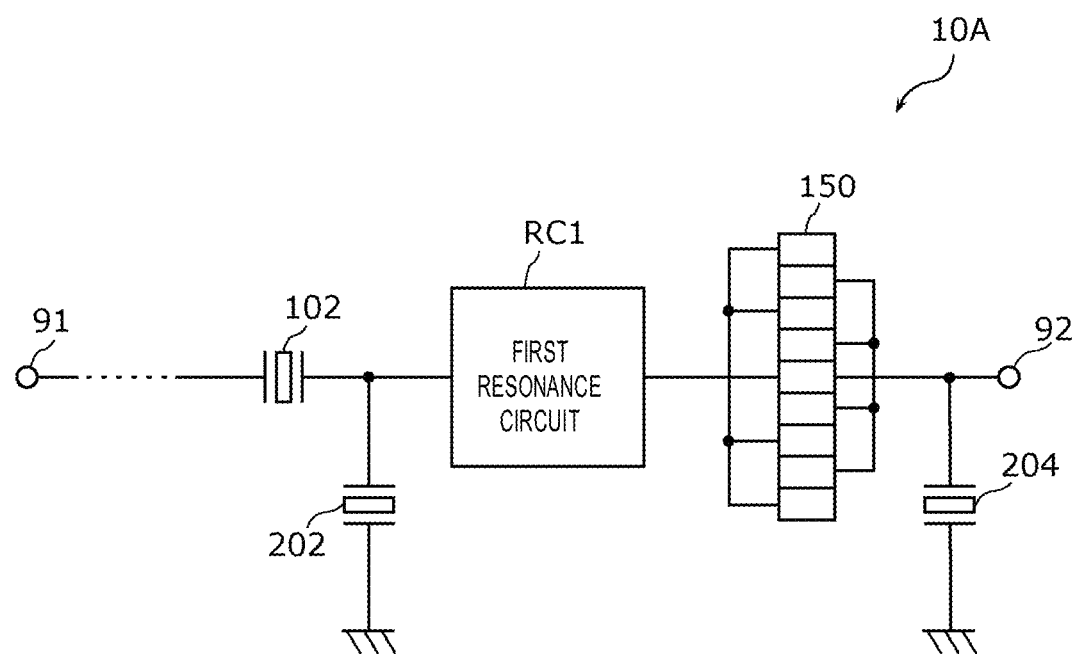
FIG. 8 is a circuit configuration diagram of an acoustic wave filter according to a modified example of a preferred embodiment of the present invention.

FIG. 8 is a circuit configuration diagram of an acoustic wave filter 10A according to a modified example of a preferred embodiment of the present invention.

As illustrated in the drawing, the acoustic wave filter 10A includes the series arm resonator 102, the first resonance circuit RC1, parallel arm resonators 202 and 204, and a longitudinally coupled resonator 150. In other words, the acoustic wave filter 10A is a filter provided by adding the longitudinally coupled resonator 150 to a ladder filter configuration.

The longitudinally coupled resonator 150 is configured as a longitudinally coupled filter provided between the first terminal 91 and the second terminal 92. The longitudinally coupled resonator 150 of the modified example is positioned on the second terminal 92 side with respect to the first resonance circuit RC1. The longitudinally coupled resonator 150 of the modified example includes nine IDTs and reflectors provided at both ends of the IDTs. The position of the longitudinally coupled resonator 150 is not limited to this example, and the longitudinally coupled resonator 150 may be positioned, for example, between the series arm resonator 102 and the first resonance circuit RC1.

Similarly to the above-described preferred embodiment, the acoustic wave filter 10A configured as described above can also reduce the insertion loss on the higher frequency side of the pass band of the acoustic wave filter 10A.

The acoustic wave filter 10 of the above-described present preferred embodiment includes the first resonance circuit RC1 including the first series arm resonator 101 and the first capacitive element C1. The first series arm resonator 101 is provided on the path connecting the first terminal 91 and the second terminal 92. The first capacitive element C1 is coupled in parallel with the first series arm resonator 101. The first series arm resonator 101 includes the first divided resonator D1 and the second divided resonator D2 coupled in series with each other. The first resonance circuit RC1 includes the second resonance circuit RC2 including the first divided resonator D1 and the second capacitive element C2 coupled in parallel with the first divided resonator D1.

As described above, by using the anti-resonant frequency of the first resonance circuit RC1 including the second resonance circuit RC2 defined by coupling the second capacitive element C2 in parallel with the first divided resonator D1, it is possible to define an attenuation pole on the higher frequency side than the pass band. With this configuration, for example, the increase of the resonant frequency of the second resonance circuit RC2 increases the resonant frequency of the first resonance circuit RC1, and as a result, it is possible to obtain a steep attenuation slope on the higher frequency side than the pass band of the acoustic wave filter 10 and also reduce the insertion loss on the higher frequency side of the pass band of the acoustic wave filter 10.

Furthermore, the anti-resonant frequency of the second resonance circuit RC2 may be the same or substantially the same as the anti-resonant frequency of the second divided resonator D2.

Since the anti-resonant frequency of the second resonance circuit RC2 is the same or substantially the same as the anti-resonant frequency of the second divided resonator D2, the anti-resonant frequency of the first resonance circuit RC1 is set at a suitable level, and as a result, it is possible to define an attenuation pole on the higher frequency side than the pass band. With this configuration, for example, the increase of the resonant frequency of the second resonance circuit RC2 increases the resonant frequency of the first resonance circuit RC1, and as a result, it is possible to obtain a steep attenuation slope on the higher frequency side than the pass band of the acoustic wave filter 10 and also reduce the insertion loss on the higher frequency side of the pass band of the acoustic wave filter 10.

Moreover, the resonant frequency of the second resonance circuit RC2 may be higher than the resonant frequency of the second divided resonator D2.

As such, it is possible to increase the resonant frequency of the first resonance circuit RC1. As a result, it is possible to reduce the insertion loss on the higher frequency side of the pass band of the acoustic wave filter 10.

Further, the resonance bandwidth, which is a range between a resonant frequency and an anti-resonant frequency, of the second resonance circuit RC2 may be narrower than the resonance bandwidth of the second divided resonator D2.

As such, it is possible to increase the resonant frequency of the first resonance circuit RC1. As a result, it is possible to reduce the insertion loss on the higher frequency side of the pass band of the acoustic wave filter 10.

Furthermore, the second capacitive element C2 may have a different capacitance than that of the first capacitive element C1.

As such, it is possible to adjust the anti-resonant frequency of the first resonance circuit RC1 including the second resonance circuit RC2. As a result, it is possible to define an attenuation pole at an appropriate position on the higher frequency side than the pass band.

Furthermore, the second capacitive element C2 may have a smaller capacitance than the first capacitive element C1.

As such, it is possible to make fine adjustments to the anti-resonant frequency of the first resonance circuit RC1 including the second resonance circuit RC2. As a result, it is possible to define an attenuation pole at an appropriate position on the higher frequency side than the pass band.

Further, the acoustic wave filter 10 further includes the second series arm resonator 102 coupled in series with the first resonance circuit RC1 and also includes the parallel arm resonator 202 provided between the ground and the node between the first resonance circuit RC1 and the second series arm resonator 102. The resonant frequency of the first resonance circuit RC1 and the resonant frequency of the second series arm resonator 102 may be within the pass band of the acoustic wave filter 10. The anti-resonant frequency of the first resonance circuit RC1 may be lower than the anti-resonant frequency of the second series arm resonator 102.

As described above, by configuring the first resonance circuit RC1 to have an anti-resonant frequency lower than the anti-resonant frequency of the series arm resonator 102, it is possible to define an attenuation pole on the higher frequency side than the pass band. As such, it is possible to define the attenuation pole of the acoustic wave filter 10 and also reduce the insertion loss on the higher frequency side of the pass band. It should be noted that the same advantageous effects are achieved with the configuration in which the second series arm resonator 102 is replaced with the second series arm resonator 103 while the parallel arm resonator 202 is replaced with the parallel arm resonator 203.

While the acoustic wave filters according to the above-described preferred embodiments have been described, the present invention is not limited to that preferred embodiments. For example, the present invention can include the following modifications to the above-described preferred embodiment.

While the above-described preferred embodiments are examples in which the second resonance circuit RC2 is coupled in series with the second series arm resonator 102 and the second divided resonator D2 is coupled in series with the second series arm resonator 103, the same may apply in reverse. Specifically, the second divided resonator D2 is coupled in series with the second series arm resonator 102 and the second resonance circuit RC2 is coupled in series with the second series arm resonator 103.

For example, the acoustic wave filter 10 may be used as a transmission or reception filter. For example, in the case in which the acoustic wave filter 10 is a transmission filter, the acoustic wave filter 10 may receive a transmitting wave generated by a transmission circuit (RFIC or the like, for example) and inputted via the second terminal 92, filter the transmitting wave in accordance with a particular transmission pass band, and output the filtered transmitting wave to the second terminal 92. In the case in which the acoustic wave filter 10 is a reception filter, the acoustic wave filter 10 may receive a received wave inputted from the first terminal 91, filter the received wave in accordance with a particular reception pass band, and output the filtered received wave to the second terminal 92.

Moreover, the first terminal 91 and the second terminal 92 may be input and output terminals. For example, when the first terminal 91 is an input terminal, the second terminal 92 is an output terminal, and when the second terminal 92 is an input terminal, the first terminal 91 is an output terminal.

Preferred embodiments of the present invention can be used as an acoustic wave filter with reduced insertion loss in the pass band for a multiplexer, a radio-frequency front-end circuit, a communication device, or the like, for example, and widely applied to communication devices such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a first resonance circuit including a first series arm resonator and a first capacitive element, the first series arm resonator being provided on a path connecting a first terminal and a second terminal, the first capacitive element being coupled in parallel with the first series arm resonator; wherein
the first series arm resonator includes a first divided resonator and a second divided resonator coupled in series with each other;
the first resonance circuit includes a second resonance circuit including the first divided resonator and a second capacitive element coupled in parallel with the first divided resonator, one terminal of the second capacitive element being coupled to one node between the first divided resonator and the second divided resonator, and another terminal of the second capacitive element being coupled to another node at the opposite side to the one node from the first divided resonator; and
no capacitive element is coupled in parallel with the second divided resonator.

2. The acoustic wave filter according to claim 1, wherein an anti-resonant frequency of the second resonance circuit is the same or substantially the same as an anti-resonant frequency of the second divided resonator.

3. The acoustic wave filter according to claim 1, wherein a resonant frequency of the second resonance circuit is higher than a resonant frequency of the second divided resonator.

4. The acoustic wave filter according to claim 1, wherein a resonance bandwidth of the second resonance circuit is narrower than a resonance bandwidth of the second divided resonator, where the resonance bandwidth is a range between a resonant frequency and an anti-resonant frequency.

5. The acoustic wave filter according to claim 1, wherein the second capacitive element has a different capacitance than that of the first capacitive element.

6. The acoustic wave filter according to claim 1, wherein the second capacitive element has a smaller capacitance than that of the first capacitive element.

7. The acoustic wave filter according to claim 1, wherein the first divided resonator has a resonance frequency and an anti-resonant frequency higher than a resonance frequency and an anti-resonant frequency of the second divided resonator.

8. The acoustic wave filter according to claim 1, wherein the second capacitive element has a capacitance in a range of about 0.1 to about 0.3 times a capacitance of the first capacitive element.

9. The acoustic wave filter according to claim 1, wherein the first series arm resonator includes a piezoelectric substrate and an interdigital transducer electrode including comb-shaped electrodes that are interleaved with one another.

10. The acoustic wave filter according to claim 9, wherein the interdigital transducer electrode has a layered structure including a fixing layer and a main electrode layer.

11. The acoustic wave filter according to claim 10, wherein the fixing layer is made of Ti.

12. The acoustic wave filter according to claim 10, wherein the fixing layer has a thickness of about 12 nm.

13. The acoustic wave filter according to claim 10, wherein the main electrode layer is made of Al including about 1% Cu.

14. The acoustic wave filter according to claim 10, wherein the main electrode layer has a thickness of about 162 nm.

15. The acoustic wave filter according to claim 9, wherein the interdigital transducer electrode includes a protective layer covering the comb-shaped electrodes.

16. The acoustic wave filter according to claim 15, wherein the protective layer is defined by a dielectric film mainly including silicon dioxide.

17. The acoustic wave filter according to claim 1, wherein the first divided resonator and the second divided resonator are coupled in series with each other without a parallel circuit arm coupled between a node between the first and second divided resonators and a ground.

18. An acoustic wave filter comprising:
a first resonance circuit including a first series arm resonator and a first capacitive element, the first series arm resonator being provided on a path connecting a first terminal and a second terminal, the first capacitive element being coupled in parallel with the first series arm resonator;
a second series arm resonator coupled in series with the first resonance circuit; and
a parallel arm resonator between a ground and a node between the first resonance circuit and the second series arm resonator; wherein
the first series arm resonator includes a first divided resonator and a second divided resonator coupled in series with each other;
the first resonance circuit includes a second resonance circuit including the first divided resonator and a second capacitive element coupled in parallel with the first divided resonator, one terminal of the second capacitive element being coupled to one node between the first divided resonator and the second divided resonator, and another terminal of the second capacitive element being coupled to another node at the opposite side to the one node from the first divided resonator;
a resonant frequency of the first resonance circuit and a resonant frequency of the second series arm resonator are within a pass band of the acoustic wave filter; and
an anti-resonant frequency of the first resonance circuit is lower than an anti-resonant frequency of the second series arm resonator.

19. An acoustic wave filter comprising:
a first resonance circuit including a first series arm resonator and a first capacitive element, the first series arm resonator being provided on a path connecting a first terminal and a second terminal, the first capacitive element being coupled in parallel with the first series arm resonator; and
a longitudinally coupled resonator provided between the first terminal and the second terminal; wherein
the first series arm resonator includes a first divided resonator and a second divided resonator coupled in series with each other; and
the first resonance circuit includes a second resonance circuit including the first divided resonator and a second capacitive element coupled in parallel with the first divided resonator, one terminal of the second capacitive element being coupled to one node between the first divided resonator and the second divided resonator, and another terminal of the second capacitive element being coupled to another node at the opposite side to the one node from the first divided resonator.

20. The acoustic wave filter according to claim 19, wherein the longitudinally coupled resonator is closer to the second terminal than is the first resonance circuit.

* * * * *